United States Patent [19]

Repenning et al.

[11] Patent Number: 5,205,188
[45] Date of Patent: Apr. 27, 1993

[54] FRICTION PAIRING AND PROCESS FOR ITS PRODUCTION

[76] Inventors: Detlef Repenning, Seelandstrasse 65, 24000 Luebeck 14; Barry L. Mordike, Edelhof 3, 3360 Osterode-Dorste, both of Fed. Rep. of Germany

[21] Appl. No.: 786,809

[22] Filed: Nov. 5, 1991

[30] Foreign Application Priority Data

Nov. 5, 1990 [DE] Fed. Rep. of Germany ... 9015179[U]
Aug. 21, 1991 [DE] Fed. Rep. of Germany ....... 4127639

[51] Int. Cl.[5] .................. F16H 53/06; B32B 9/00
[52] U.S. Cl. .................................... 74/569; 428/408; 427/38
[58] Field of Search ................ 74/567, 569; 428/408, 428/457, 610, 627; 427/38

[56] References Cited

U.S. PATENT DOCUMENTS

| | | | |
|---|---|---|---|
| 4,540,636 | 9/1985 | MacIver et al. | 428/627 X |
| 4,554,208 | 11/1985 | MacIver et al. | 428/208 X |
| 4,618,505 | 10/1986 | MacIver et al. | 427/38 |
| 4,873,150 | 10/1989 | Doi et al. | 428/627 |
| 4,911,625 | 5/1990 | Begg et al. | 428/610 X |
| 4,974,498 | 12/1990 | Lemelson | 92/223 |
| 5,007,165 | 4/1991 | Podhorsky | 74/567 X |
| 5,052,845 | 10/1991 | Maus et al. | 74/567 X |

FOREIGN PATENT DOCUMENTS 0435312 7/1991 European Pat. Off. .
3712205 10/1988 Fed. Rep. of Germany .
2128637 5/1984 United Kingdom .

OTHER PUBLICATIONS

Patent Abstracts of Japan of JP 62 111 106, vol. 11, No. 330.

*Primary Examiner*—Rodney H. Bonck
*Assistant Examiner*—Andrea Pitts
*Attorney, Agent, or Firm*—Foley & Lardner

[57] ABSTRACT

A friction pairing of cam running surface/counterrunner layer as well as to a process for its production are described. To reduce the friction values, the counterrunner layer is a nanodisperse, amorphous, metal-carbon layer comprising 50 to 90 atomic % of carbon, 2 to 25 atomic % of hydrogen and any remainder of metal, the carbon being partly in the form of a diamond bond structure.

20 Claims, 1 Drawing Sheet

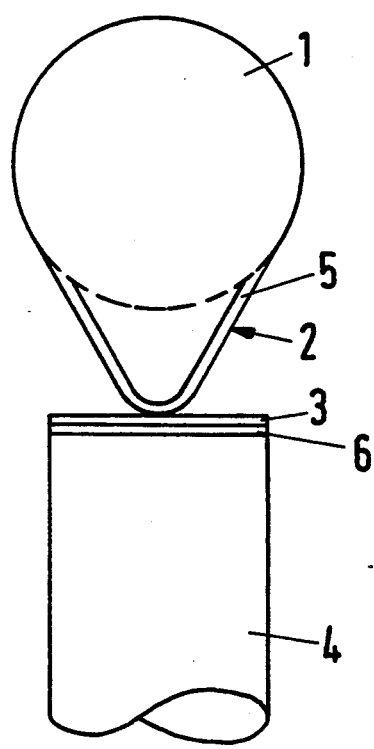

FRICTION PAIRING AND PROCESS FOR ITS PRODUCTION

BACKGROUND OF THE INVENTION

The invention relates to a friction pairing, comprising a cam running surface of a camshaft and a counterrunner layer, which is applied to the base material of a counterrunner, designed for example as a bucket tappet, valve lever, or rocker lever. The invention relates furthermore to a process for the production of such a friction pairing.

The pairing material, usually used for valve control, of, for example, bucket tappets and camshafts, comprising case-hardening steel and chilled cast iron in a nitrided or unnitrided state, usually exhibits high friction values and, accordingly, also high wear. Furthermore, it proves to be disadvantageous that the valve spring load cannot be further increased. Such an increase would be desirable for more precise valve control.

SUMMARY OF THE INVENTION

Accordingly it is an object of the invention to provide a friction pairing having reduced friction values and lower wear.

It is further an object to provide a method for producing such a friction pairing.

In accomplishing the foregoing objectives, there has been provided, in accordance with one aspect of the present invention, a friction pairing comprising:

a) a camshaft which contains a cam running surface, and
b) a counterrunner base which has applied to it a counterrunner layer which interacts with the cam running surface, wherein said counterrunner layer comprises a nanodisperse, amorphous, metal-carbon layer comprising:
  i) about 50 to about 90 atomic percent carbon which is at least partly in the form of a diamond bond structure,
  ii) about 2 to about 25 atomic percent hydrogen, and
  iii) up to about 48 atomic percent of at least one metal.

In accordance with another object of the invention there is provided a process for producing the friction pairing comprising the steps of:

A. providing a camshaft with a cam running surface, and
B. producing on a counterrunner base a counterrunner layer which interacts with said cam running surface.

Further objects, features, and advantages of the present invention will become apparent from the detailed description of preferred embodiments that follows.

BRIEF DESCRIPTION OF THE DRAWING

The drawing shows a friction pairing which represents an embodiment of the invention.

DETAILED DESCRIPTION OF THE PREFERRED EMBODIMENTS

The friction pairing comprises a counterrunner layer being a nanodisperse, amorphous, metal-carbon layer of which about 50 to about 90 atomic % comprises carbon, about 2 to about 25 atomic % comprises hydrogen and the remainder comprising one or more metals, wherein at least part of the carbon is in the form of a diamond bond structure.

The particular advantages of this counterrunner layer is, on the one hand, its low friction coefficient when in contact with metallic sliding counterparts and, on the other hand, that the engine oil does not catalytically decompose to form siccatives when in sliding contact with the layer.

The carbon layer forming the counterrunner layer can be produced by various processes. Specifically, production is possible by the plasma CVD process, by which ion-carbon (i-C) or amorphous-carbon hydrogen (a-CH) can be produced, which contain no metal. Also possible is production by the PVD process, such as for example sputtering or ARC technology, wherein metals are simultaneously vaporized and incorporated into the layer to be formed, which are also referred to as metal-carbon hydrogen layers (Me-CH). In this process, the carbon forms metal carbides with the metals, so that an increased temperature resistance of the layer is obtained.

The metal of the counterrunner layer may be titanium, niobium, tantalum, chromium, molybdenum, iron, and/or tungsten. Preferably the metals tungsten, tantalum, and/or titanium are incorporated into the counterrunner layer, either individually or else as alloying constituents from mixed-crystal alloy vaporizer plates.

The counterrunner layer preferably has a thickness of about 2 to about 12 micrometers, a hardness (H) of greater than about 2000 HV 0.01, a glass-like structure and/or a surface roughness (Rz) between about 0.8 and about 3 micrometers and having no sharp peaks.

The carbon-containing counterrunner layer may comprise more than one layer. Furthermore, the layer or layers are preferably applied to the base material with at least one intermediate layer between the base material and the counterrunner layer. Chromium or chromium-containing intermediate layers are particularly suitable for this purpose. An especially preferred layer is a chromium/chromium nitride combination. The intermediate layer produces an advantage of increased adhesive strength for the amorphous diamond-like carbon layer. Furthermore, there is an additional advantage that, with this very adhesively strong intermediate layer, a tribologically favorably acting "sliding and wearing reserve" is created. Particularly, if the applied amorphous layer is partially worn or damaged after a certain service life, the chromium nitride layer acts in such a way as to retard wear or oil decomposition.

Instead of chromium nitride, other, similarly acting metals can be used for the intermediate layer, such as, for example, titanium nitride, titanium carbide, zirconium nitride, and the like.

The thickness of the intermediate layer is preferably about 0.1 to about 5 micrometers.

In order to achieve a favorable lubrication bore relief effect from the outset, it is advantageous if, before applying the counterrunner layer or the intermediate layer to the base material of the counterrunner, the surface of the counterrunner to be coated is provided with a textured ground finish having a peak-to-value height of about 0.5 to about 10 micrometers. Alternatively, a so-called orange skin may also be produced on the surface to which the counterrunner is applied.

In a particular advantageous friction pairing, the cam running surface has an ultrafine-grained ledeburitic layer, which is hardened by a laser remelting process. It is advantageous if the layer forming the cam running surface is ground to a fine finish after laser remelting.

The thickness of the layer forming the ready-machined cam running surface is preferably about 50 to about 400 micrometers.

The drawing represents an embodiment of the invention. The drawing shows a camshaft 1 having a cam running surface 2, which interacts with a counterrunner layer 3 of a counterrunner 4.

The cam running surface 2 is formed by an ultra-fine-grained ledeburitic layer 5, which is hardened by the laser remelting process.

The counterrunner layer 3 is a cerite layer, which is applied over an intermediate layer 6 to the counter-runner 4, which may consist, for example, of 16 MnCr 5.

What is claimed is:

1. A friction pairing comprising:
    a) a camshaft which contains a cam running surface,
    b) a counterrunner base; and
    c) a counterrunner layer which is applied to said counterrunner base and which interacts with said cam running surface,
    wherein said counterrunner layer comprises a nano-disperse, amorphous, layer including:
        i) about 50 to about 90 atomic percent carbon which at least partly is in the form of a diamond bond structure,
        ii) about 2 to about 25 atomic percent hydrogen, and
        iii) up to about 48 atomic percent of at least one metal.

2. A friction pairing of claim 1, wherein said counterrunner layer comprises a metal selected from the group consisting of titanium, niobium, tantalum, chromium, molybdenum, iron, tungsten, alloys thereof, and mixtures of two or more of the preceding metals.

3. A friction pairing of claim 1, wherein said metal is selected from the group consisting of tungsten, tantalum, and titanium.

4. A friction pairing of claim 2, wherein said metal comprises an alloy of one of tungsten, tantalum, and titanium, from mixed alloy vaporizer plates.

5. A friction pairing of claim 1, wherein said base is provided with a textured ground finish having a peak-to-value height of about 0.5 to about 10 micrometers before said counterrunner layer is applied to it.

6. A friction pairing of claim 1, wherein said cam running surface comprises an ultrafine-grained ledeburitic layer which has been hardened by a laser remelting process.

7. A friction pairing of claim 6, wherein said ledeburitic layer has a thickness of about 50 to about 400 micrometers.

8. A friction pairing of claim 6, wherein said ledeburitic layer has been ground to a fine finish after said laser remelting.

9. A friction pairing comprising:
    a) a camshaft which contains a cam running surface,
    b) a counterrunner base; and
    c) a counterrunner layer having a thickness of about 2 to about 12 micrometers which is applied to said counterrunner base and which interacts with said cam running surface,
    wherein said counterrunner layer comprises a nano-disperse, amorphous, layer including:
        i) about 50 to about 90 atomic percent carbon which at least partly is in the form of a diamond bond structure,
        ii) about 2 to about 25 atomic percent hydrogen, and
        iii) up to about 48 atomic percent of at least one metal.

10. A friction pairing of claim 9, wherein said counterrunner layer does not contain a metal.

11. A friction pairing of claim 9, wherein said counterrunner layer contains a metal selected from the group consisting of titanium, niobium, tantalum, chromium, molybdenum, iron, tungsten, alloys of any of the preceding metals, and mixtures of two or more of the preceding metals and alloys.

12. A friction pairing of claim 9, wherein said layer has a hardness of greater than about 2000 HV 0.01, and has a glass-like structure.

13. A friction pairing of claim 12, wherein said layer has no sharp peaks and a surface roughness of between about 0.8 and about 3 micrometers.

14. A friction pairing comprising:
    a) a camshaft which contains a cam running surface,
    b) a counterrunner base;
    c) a counterrunner layer which is applied to said counterrunner base and which interacts with said cam running surface, and
    d) an intermediate layer between said base and said counterrunner layer,
    wherein said counterrunner layer comprises a nano-disperse, amorphous, layer including:
        i) about 50 to about 90 atomic percent carbon which at least partly is in the form of a diamond bond structure,
        ii) about 2 to about 25 atomic percent hydrogen, and
        iii) up to about 48 atomic percent of at least one metal.

15. A friction pairing of claim 14, wherein said counterrunner layer does not contain a metal.

16. A friction pairing of claim 14, wherein said counterrunner layer contains a metal selected from the group consisting of titanium, niobium, tantalum, chromium, molybdenum, iron, tungsten, alloys of any of the preceding metals, and mixtures of two or more of the preceding metals and alloys.

17. A friction pairing of claim 14, wherein said intermediate layer comprises chromium.

18. A friction pairing of claim 17, wherein said intermediate layer further comprises at least one of chromium nitride, titanium nitride, titanium carbide, or zirconium nitride.

19. A friction pairing of claim 18, wherein said intermediate layer comprises said chromium nitride.

20. A friction pairing of claim 24, wherein said intermediate layer has a thickness of about 0.1 to about 5 micrometers.

* * * * *